United States Patent
Hou (10) Patent No.: US 11,239,299 B2
(45) Date of Patent: Feb. 1, 2022

(54) ARRAY SUBSTRATE AND METHOD FOR MANUFACTURING THE SAME

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 36 days.

(21) Appl. No.: 16/538,081

(22) Filed: Aug. 12, 2019

(65) Prior Publication Data
US 2020/0266258 A1 Aug. 20, 2020

(30) Foreign Application Priority Data
Feb. 15, 2019 (CN) .......................... 201910115716.9

(51) Int. Cl.
*H01L 27/32* (2006.01)
*H01L 51/00* (2006.01)
(Continued)

(52) U.S. Cl.
CPC ...... *H01L 27/3272* (2013.01); *H01L 27/3246* (2013.01); *H01L 51/004* (2013.01); *H01L 51/0018* (2013.01); *H01L 51/0035* (2013.01); *H01L 51/0048* (2013.01); *H01L 51/56* (2013.01); *G03F 7/038* (2013.01); *G03F 7/2002* (2013.01); *G03F 7/26* (2013.01); *H01L 2227/323* (2013.01)

(58) Field of Classification Search
CPC ...... G03F 7/0007; G03F 7/038; G03F 7/2002; G03F 7/26; H01L 2227/323; H01L 27/3246; H01L 27/3272; H01L 51/0018; H01L 51/0035; H01L 51/004; H01L 51/0048; H01L 51/56
See application file for complete search history.

(56) References Cited

U.S. PATENT DOCUMENTS

2005/0001486 A1* 1/2005 Schripsema .......... G01D 4/004
307/80
2005/0264182 A1* 12/2005 Seki .................... H01L 27/3246
313/503
(Continued)

FOREIGN PATENT DOCUMENTS

| CA | 104253141 A | 12/2014 |
| CA | 109273488 A | 1/2019 |

OTHER PUBLICATIONS

China First Office Action, Application No. 201910115716.9, dated Jul. 14, 2020, 15 pps.: with English translation.
(Continued)

*Primary Examiner* — Shaun M Campbell
(74) *Attorney, Agent, or Firm* — Armstrong Teasdale LLP (57) ABSTRACT

The present disclosure relates to an array substrate and a method for manufacturing the same. The array substrate includes a substrate having first regions for forming pixels and second regions located between the first regions, light shielding portions located within portions of the second regions adjacent to the first regions on the substrate, and pixel defining portions located within the second regions. At least a side surface of the light shielding portion adjacent to the first region is not covered by the pixel defining portion.

14 Claims, 5 Drawing Sheets

(51) Int. Cl.
*H01L 51/56* (2006.01)
*G03F 7/038* (2006.01)
*G03F 7/20* (2006.01)
*G03F 7/26* (2006.01)

(56) References Cited

U.S. PATENT DOCUMENTS

| | | | |
|---|---|---|---|
| 2015/0001486 A1* | 1/2015 | Kim | H01L 27/3246 257/40 |
| 2018/0033841 A1 | 2/2018 | Yang et al. | |
| 2018/0331165 A1* | 11/2018 | Li | H01L 51/5203 |
| 2019/0237525 A1* | 8/2019 | Zhao | H01L 51/56 |
| 2020/0251541 A1* | 8/2020 | Kim | H01L 27/3246 |
| 2020/0303687 A1* | 9/2020 | Liu | H01L 51/0017 |

OTHER PUBLICATIONS

China Second Office Action, Application No. 201910115716.9, dated Jan. 27, 2021, 12 pps.: with English translation.

* cited by examiner

ARRAY SUBSTRATE AND METHOD FOR MANUFACTURING THE SAME

CROSS REFERENCE TO RELATED APPLICATIONS

This patent application claims the benefit and priority of Chinese Patent Application No. 201910115716.9 filed on Feb. 15, 2019, the disclosure of which is incorporated by reference herein in its entirety as part of the present application.

BACKGROUND

Embodiments of the present disclosure relate to a field of display technologies, and in particular, to an array substrate and a method for manufacturing the same.

An organic light emitting diode (OLED) display has the advantages of self-luminescence, fast response, wide viewing angle, high brightness, colorful color, and lighter weight and thinner thickness compared with a liquid crystal display (LCD). Therefore, the OLED is considered to be a next generation of display technology.

A thin film deposition method for manufacturing an OLED display mainly includes a vacuum evaporation method and a solution-based processing method. The vacuum evaporation method is suitable for organic small molecules. The vacuum evaporation method enables uniform film formation and the technology of this method is relatively mature. However, the vacuum evaporation method has disadvantages such as large equipment investment, low material utilization rate, and low accuracy for mask alignment to large-sized products. On the other hand, the solution-based processing method may include spin coating, ink jet printing, nozzle coating, and the like. The solution-based processing method is suitable for polymeric materials and soluble small molecules. In addition, the solution-based processing method enables low equipment cost and has outstanding advantages in large-scale and large-scale production.

BRIEF DESCRIPTION

Embodiments of the present disclosure provide an array substrate and a method for manufacturing the same.

An aspect of the present disclosure provides an array substrate. The array substrate includes a substrate having first regions for forming pixels and second regions located between the first regions, light shielding portions located within portions of the second regions adjacent to the first regions on the substrate, and pixel defining portions located within the second regions. At least a side surface of the light shielding portion adjacent to the first region is not covered by the pixel defining portion.

In an embodiment of the present disclosure, a material of the pixel defining portion includes a negative photoresist. The light shielding portion can absorb a light having a sensitive wavelength of the negative photoresist.

According to an embodiment of the present disclosure, the pixel defining portion covers at least a portion of a top surface of the light shielding portion and a side surface of the light shielding portion away from the first region.

According to an embodiment of the present disclosure, a ratio of a dimension of the pixel defining portion in a direction perpendicular to the substrate to a dimension of the light shielding portion in a direction perpendicular to the substrate is 5:1 to 15:1.

According to an embodiment of the present disclosure, the light shielding portion has a dimension of 0.1 to 0.5 μm in a direction perpendicular to the substrate and a dimension of 2 to 10 μm in a direction parallel to the substrate.

According to an embodiment of the present disclosure, the negative photoresist is a photoresist sensitive to ultraviolet light. A material of the light shielding portion includes a material absorbing the ultraviolet light.

According to an embodiment of the present disclosure, the material absorbing the ultraviolet light includes a metal oxide and/or a carbon-containing material.

According to an embodiment of the present disclosure, the metal oxide includes titanium oxide or lead oxide. The carbon-containing material includes carbon black or carbon nanotubes.

According to an embodiment of the present disclosure, the material of the pixel defining portion includes polyimide, polymethyl methacrylate, fluorinated polyimide, or fluorinated polymethyl methacrylate.

According to an embodiment of the present disclosure, the array substrate further includes a conductive layer located on the substrate and located between the pixel defining portions.

Another aspect of the present disclosure provides a method for manufacturing an array substrate. The method includes providing a substrate having first regions for forming pixels and second regions located between the first regions, forming light shielding portions within portions of the second regions adjacent to the first regions on the substrate, and forming pixel defining portions within the second regions. At least a side surface of the light shielding portion adjacent to the first region is not covered by the pixel defining portion.

According to an embodiment of the present disclosure, forming the light shielding portions includes forming a light shielding material layer on the substrate, wherein a material of the light shielding material layer includes a material absorbing ultraviolet light, and patterning the light shielding material layer to form the light shielding portions within the portions of the second regions adjacent to the first regions on the substrate.

According to an embodiment of the present disclosure, a material of the pixel defining portion includes a photoresist.

According to an embodiment of the present disclosure, forming the pixel defining portions includes forming a pixel defining material layer on the substrate and the light shielding portions, and exposing and developing the pixel defining material layer to remove a portion of the pixel defining material layer located within the first region, to expose a side surface of the light shielding portion adjacent to the first region.

According to an embodiment of the present disclosure, the negative photoresist is a photoresist sensitive to ultraviolet light.

Adaptive and further aspects and scope will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present application.

Corresponding reference numerals indicate corresponding parts or features throughout the several views of the drawings.

DETAILED DESCRIPTION

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. Where used herein the term "examples," particularly when followed by a listing of terms is merely exemplary and illustrative, and should not be deemed to be exclusive or comprehensive.

Additionally, further to be noted, when the elements and the embodiments thereof of the present application are introduced, the articles "a/an", "one", "the" and "said" are intended to represent the existence of one or more elements. Unless otherwise specified, "a plurality of" means two or more. The expressions "comprise", "include", "contain" and "have" are intended as inclusive and mean that there may be other elements besides those listed. The terms such as "first" and "second" are used herein only for purposes of description and are not intended to indicate or imply relative importance and the order of formation.

The flow diagrams depicted herein are just one example. There may be many variations to this diagram or the steps (or operations) described therein without departing from the spirit of the disclosure. For instance, the steps may be performed in a differing order or steps may be added, deleted, or modified. All of these variations are considered a part of the claimed disclosure.

In addition, in the drawings, the thickness and area of each layer are exaggerated for clarity. It should be understood that when a layer, a region, or a component is referred to as being "on" another part, it is meant that it is directly on the another part, or there may be other components in between. In contrast, when a certain component is referred to as being "directly" on another component, it is meant that no other component lies in between.

Example embodiments will now be described more fully with reference to the accompanying drawings.

Figure 1:
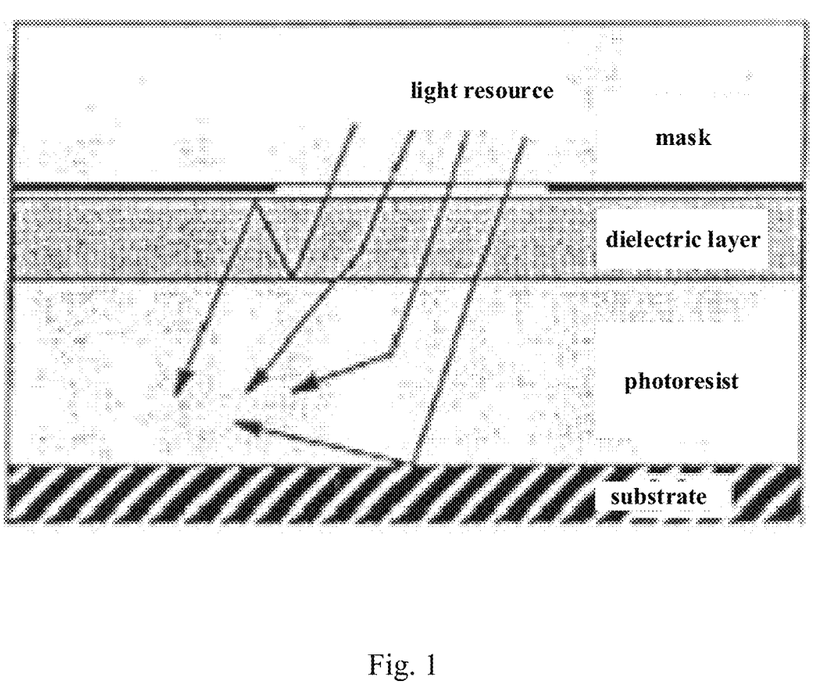
FIG. 1 illustrates a schematic view of a scattering of a light.

In an OLED display, a function of pixel defining portions is to define the dimension of pixels. However, during the process of manufacturing the pixel defining portion, an edge of the manufactured pixel defining portion has a long tail due to an effect of optical scattering introduced by the exposure process. This may affect a dimension of an actual opening for the pixel, thereby affecting the performance of the OLED display. For example, as shown in FIG. 1, when a photoresist is exposed through an opening of a mask, light from a light source is scattered within a dielectric layer and the photoresist, thereby affecting the exposure effect and thus forming a tail.

Figure 2:
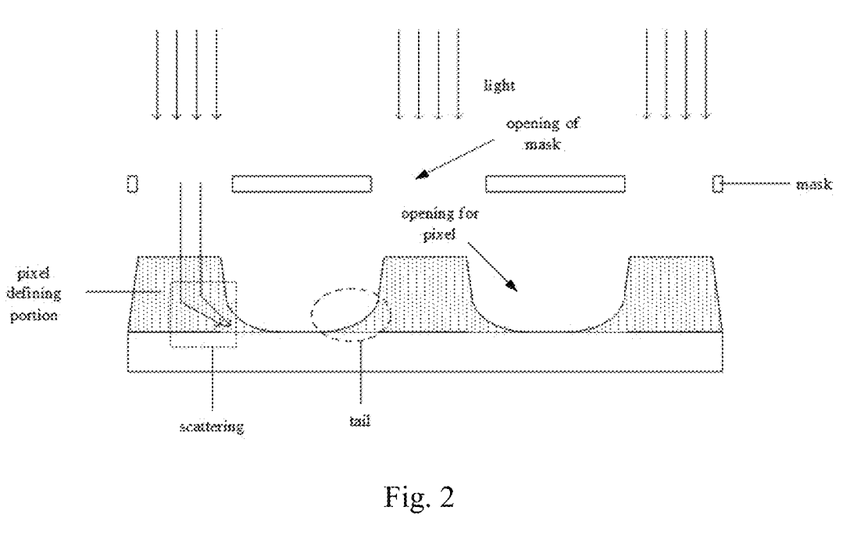
FIG. 2 illustrates a schematic cross-sectional view of a pixel defining portion with a tail.

In particular, FIG. 2 illustrates a schematic cross-sectional view of a pixel defining portion with a tail. During a process for manufacturing the pixel defining portion, in the case where a material of the pixel defining portion includes a negative photoresist, when a portion of the negative photoresist to be formed into the pixel defining portion is exposed by using a mask, a portion of the light for exposure is scattered at a bottom of the resist due to the effect of optical scattering and then enters into the negative photoresist within a region for forming an opening for the pixel, thereby forming the tail.

Embodiments of the present disclosure provide an array substrate and a method for manufacturing the same, which can avoid an influence of the optical scattering on a dimension of an opening for a pixel, thereby improving device performance.

Figure 3:
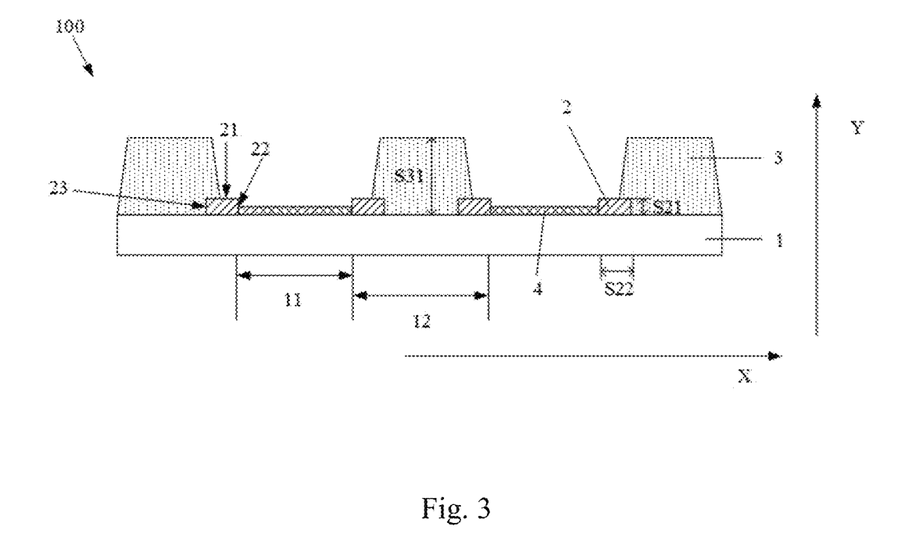
FIG. 3 illustrates a schematic cross-sectional view of an array substrate in accordance with an embodiment of the present disclosure.

FIG. 3 illustrates a schematic cross-sectional view of an array substrate in accordance with an embodiment of the present disclosure. As shown in FIG. 3, the array substrate 100 includes a substrate 1 having first regions 11 for forming pixels and second regions 12 located between the first regions 11, light shielding portions 2 located within portions of the second regions 12 adjacent to the first regions 11 on the substrate 1, and pixel defining portions 3 located within the second regions 12. It should be noted that the division of the first and second regions 11, 12 in FIG. 3 is merely exemplary and should not be considered as a limit to the disclosure.

According to an embodiment of the present disclosure, a material of the pixel defining portion 3 may include a negative photoresist. The light shielding portion 2 can absorb a light having a sensitive wavelength of the negative photoresist.

According to an embodiment of the present disclosure, at least a side surface 22 of the light shielding portion 2 adjacent to the first region 11 is not covered by the pixel defining portion 3. Thus, the scattered light can be blocked during the process for manufacturing the pixel defining portion 3, to avoid forming the tail.

According to an embodiment of the present disclosure, further, the pixel defining portion 3 covers at least a portion of a top surface 21 of the light shielding portion 2 and a side surface 23 of the light shielding portion 2 away from the first region 11.

According to an exemplary embodiment of the present disclosure, a ratio (S31:S21) of a dimension of the pixel defining portion 3 in a direction Y perpendicular to the substrate 1 to a dimension of the light shielding portion 2 in the direction Y perpendicular to the substrate 1 may be 5:1 to 15:1.

According to an exemplary embodiment of the present disclosure, the dimension S21 of the light shielding portion 2 in the direction Y perpendicular to the substrate 1 may be about 0.1 to 0.5 μm.

According to an exemplary embodiment of the present disclosure, a dimension S22 of the light shielding portion 2 in a direction X parallel to the substrate 1 may be about 2 to 10 μm.

According to an exemplary embodiment of the present disclosure, the photoresist may be a photoresist sensitive to ultraviolet light.

According to an exemplary embodiment of the present disclosure, a material of the light shielding portion 2 may include a material absorbing the ultraviolet light.

According to an exemplary embodiment of the present disclosure, the material absorbing the ultraviolet light may include a metal oxide and/or a carbon-containing material.

According to an exemplary embodiment of the present disclosure, the metal oxide may include titanium oxide or lead oxide. The carbon-containing material may include carbon black or carbon nanotubes.

According to an exemplary embodiment of the present disclosure, the material of the pixel defining portion may include polyimide, polymethyl methacrylate, fluorinated polyimide, or fluorinated polymethyl methacrylate.

According to an embodiment of the present disclosure, as shown in FIG. 3, the array substrate 100 may further include a conductive layer 4 located on the substrate 1 and located between the pixel defining portions 3. As an example, the conductive layer 4 may be, for example, an anode layer of an OLED light emitting device in an OLED display.

Embodiments of the present disclosure also provide a method for manufacturing an array substrate, which can manufacture the array substrate as described above. Thus, an influence of the optical scattering on a dimension of an opening for a pixel can be avoided, thereby improving device performance.

Figure 4:
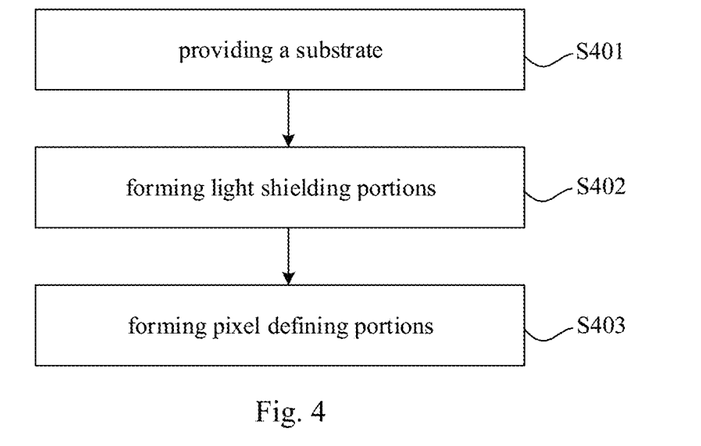
FIG. 4 illustrates a flow chart of a method for manufacturing an array substrate in accordance with an embodiment of the present disclosure.

FIG. 4 illustrates a flow chart of a method for manufacturing an array substrate in accordance with an embodiment of the present disclosure. As shown in FIG. 4, the method includes steps S401 to S403.

The method for manufacturing an array substrate will be described in detail below with reference to FIGS. 5 to 12.

Figure 5:
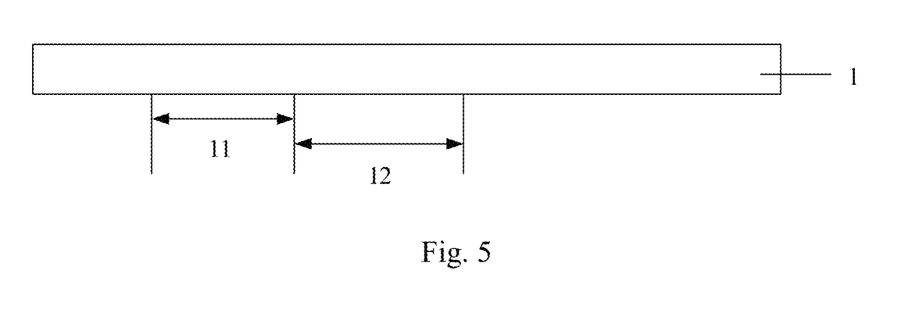
FIGS. 5 to 12 illustrate schematic cross-sectional views of the method for manufacturing the array substrate in accordance with an embodiment of the present disclosure.

In step S401, a substrate 1 is provided. As shown in FIG. 5, the substrate 1 has first regions 11 for forming pixels and second regions 12 located between the first regions 11.

In step S402, light shielding portions 2 are formed within portions of the second regions 12 adjacent to the first regions 11 on the substrate 1.

Figure 6:
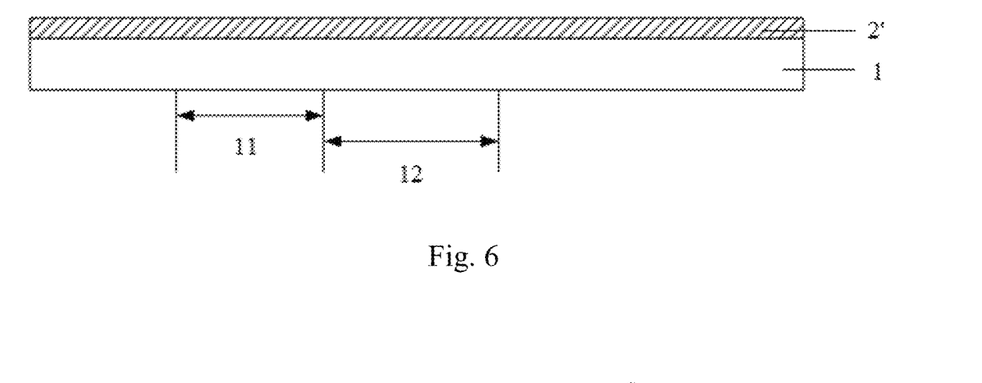
Figure 7:
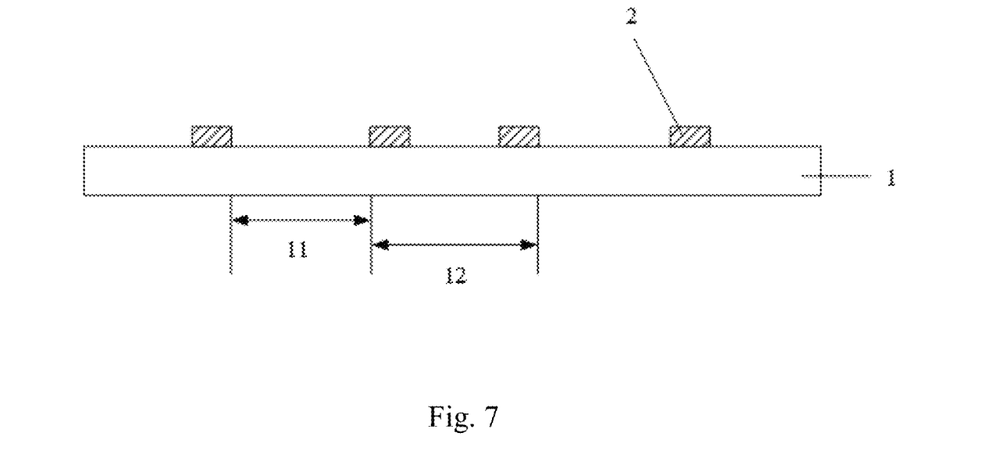

Specifically, forming the light shielding portions 2 includes as shown in FIG. 6, forming a light shielding material layer 2' on the substrate 1, and as shown in FIG. 7, patterning the light shielding material layer 2' to form the light shielding portions 2 within the portions of the second regions 12 adjacent to the first regions 11 on the substrate 1.

In step S403, the pixel defining portions 3 are formed within the second regions 12.

Figure 8:
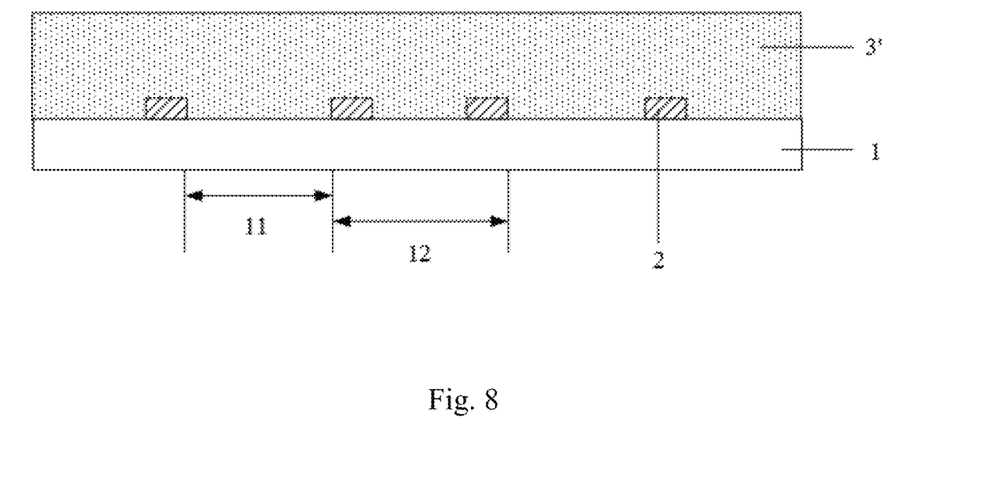
Figure 9:
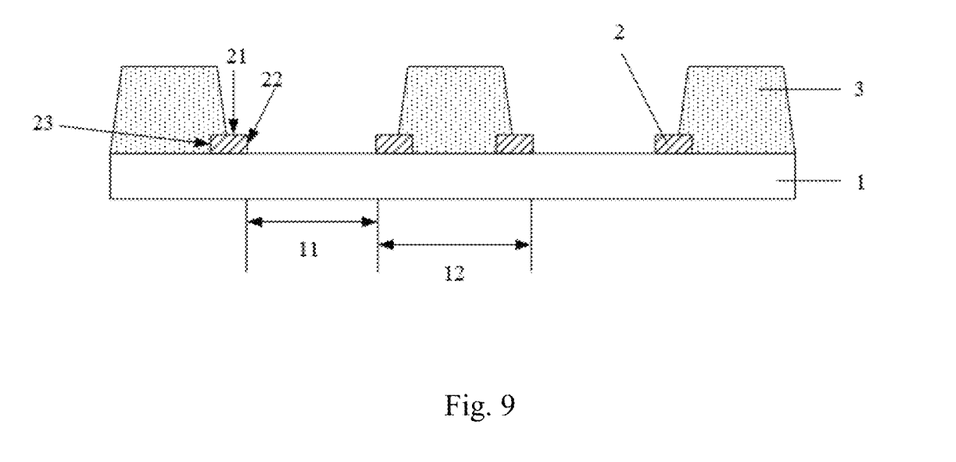

Specifically, forming the pixel defining portions 3 includes as shown in FIG. 8, forming a pixel defining material layer 3' on the substrate 1, and as shown in FIG. 9, patterning the pixel defining material layer 3' to form the pixel defining portions 3.

According to an embodiment of the present disclosure, the pixel defining material layer 3' may include a negative photoresist.

Figure 10:
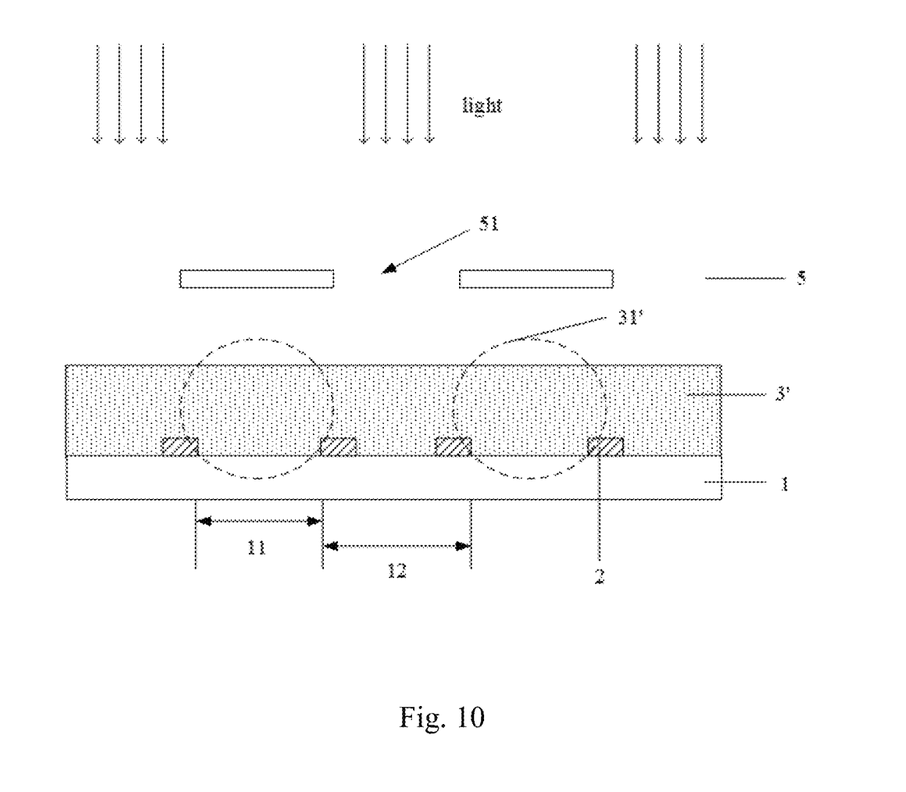

Referring to FIG. 10, the pixel defining material layer 3' located within the second regions 12 for forming the pixel defining portions is exposed through openings 51 of a mask 5 by using the mask 5. Due to the presence of the light shielding portions 2, at the bottom of the second regions 12, the light for exposure cannot be scattered into the first regions, and thus no tails are formed.

Next, the unexposed portions of the pixel defining material layer 3' are developed to remove the portions 31' of the pixel defining material layer 3' located within the first regions 11 (as shown in FIG. 10), to expose the side surfaces 22 (as shown in FIG. 9) of the light shielding portions 2 adjacent to the first regions 11.

According to an embodiment of the present disclosure, as shown in FIG. 9, at least the side surface 22 of the light shielding portion 2 adjacent to the first region 11 is not covered by the pixel defining portion 3.

According to an embodiment of the present disclosure, the photoresist described above may be a photoresist sensitive to ultraviolet light. A material of the light shielding material layer 2' may include a material absorbing the ultraviolet light.

Figure 11:
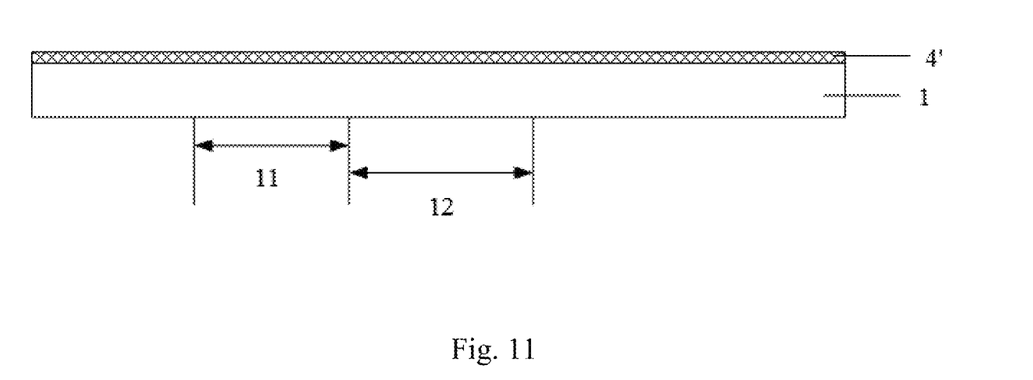
Figure 12:
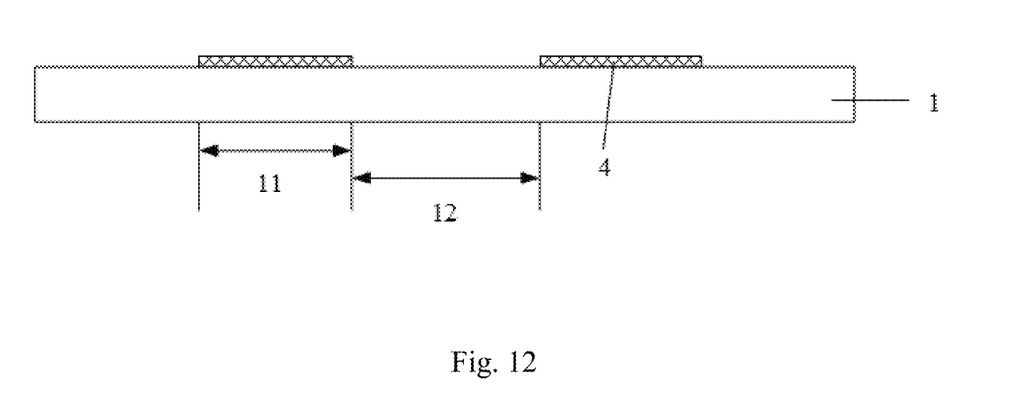

In addition, before the step S402, that is, before forming the light shielding portions 2, the method for manufacturing the array substrate may further include forming a conductive layer 4 on the substrate 1. Forming the conductive layer 4 includes as shown in FIG. 11, forming a conductive material layer 4' on the substrate 1, and as shown in FIG. 12, patterning the conductive material layer 4' to form the conductive layer 4 within the first regions 11 for forming pixels. As an example, the conductive layer 4 may be, for example, an anode layer of an OLED light emitting device in an OLED display.

It should be noted that, after the structure of FIG. 9, additional structures of the OLED light emitting device, such as a light emitting layer, a cathode layer, and the like, may be formed according to known techniques in the art, which will not be described here.

It should be noted that, in this embodiment, other descriptions about the structure of the array substrate are similar to the embodiment described with reference to FIG. 3, and details will not be described herein again.

The foregoing description of the embodiment has been provided for purpose of illustration and description. It is not intended to be exhaustive or to limit the application. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the application, and all such modifications are included within the scope of the application.

What is claimed is:

1. An array substrate comprising:
    a substrate having first regions for forming pixels and second regions located between the first regions;
    light shielding portions located within portions of the second regions adjacent to the first regions on the substrate;
    pixel defining portions located within the second regions; and
    a conductive layer located on the substrate and located between the pixel defining portions,
        wherein at least a side surface of the light shielding portion adjacent to the first region is not covered by the pixel defining portion,
        wherein the second region comprises a central region and a peripheral region surrounding the central region,
        wherein the light shielding portion is located only within the peripheral region,
        wherein an entire lower surface of the light shielding portion, an entire lower surface of the pixel defining portion, and an entire lower surface of the conductive layer are flush with each other, and
        wherein an entire upper surface of the conductive layer is not covered by the light shielding portion and the pixel defining portion, wherein an orthographic projection of the conductive layer on the substrate doesn't overlap with an orthographic projection of the light shielding portion on the substrate and an orthographic projection of the pixel defining portion on the substrate, and wherein an area of the conductive layer along a plane parallel to the substrate is equal to an area of the first region and less than an area of an opening region defined by the pixel defining portion.

2. The array substrate according to claim 1, wherein the pixel defining portion covers at least a portion of a top surface of the light shielding portion and a side surface of the light shielding portion away from the first region.

3. The array substrate according to claim 2, wherein a ratio of a dimension of the pixel defining portion in a direction perpendicular to the substrate to a dimension of the light shielding portion in a direction perpendicular to the substrate is about 5:1 to 15:1.

4. The array substrate according to claim 2, wherein the light shielding portion has a dimension of about 0.1 to 0.5 μm in a direction perpendicular to the substrate and a dimension of about 2 to 10 μm in a direction parallel to the substrate.

5. The array substrate according to claim 1, wherein a material of the pixel defining portion comprises a negative photoresist, and wherein the light shielding portion can absorb a light having a sensitive wavelength of the negative photoresist.

6. The array substrate according to claim 5, wherein the negative photoresist is a photoresist sensitive to ultraviolet light, and wherein a material of the light shielding portion comprises a material absorbing the ultraviolet light.

7. The array substrate according to claim 6, wherein the material absorbing the ultraviolet light comprises one of a metal oxide and a carbon-containing material.

8. The array substrate according to claim 7, wherein the metal oxide comprises one of titanium oxide and lead oxide, and wherein the carbon-containing material comprises one of carbon black and carbon nanotubes.

9. The array substrate according to claim 6, wherein material of the pixel defining portion comprises at least one of polyimide, polymethyl methacrylate, fluorinated polyimide, and fluorinated polymethyl methacrylate.

10. A method for manufacturing an array substrate, the method comprising:
providing a substrate having first regions for forming pixels and second regions located between the first regions;
forming a conductive layer within the first region on the substrate;
forming light shielding portions within portions of the second regions adjacent to the first regions on the substrate; and
forming pixel defining portions within the second regions, wherein at least a side surface of the light shielding portion adjacent to the first region is not covered by the pixel defining portion, wherein the second region comprises a central region and a peripheral region surrounding the central region, wherein the light shielding portion is located only within the peripheral region, wherein an entire lower surface of the light shielding portion, an entire lower surface of the pixel defining portion, and an entire lower surface of the conductive layer are flush with each other, and wherein an entire upper surface of the conductive layer is not covered by the light shielding portion and the pixel defining portion, wherein an orthographic projection of the conductive layer on the substrate doesn't overlap with an orthographic projection of the light shielding portion on the substrate and an orthographic projection of the pixel defining portion on the substrate, and wherein an area of the conductive layer along a plane parallel to the substrate is equal to an area of the first region and less than an area of an opening region defined by the pixel defining portion.

11. The method according to claim 10, wherein forming the light shielding portions comprises:
forming a light shielding material layer on the substrate, wherein a material of the light shielding material layer comprises a material absorbing ultraviolet light; and
patterning the light shielding material layer to form the light shielding portions within the portions of the peripheral regions of the second regions adjacent to the first regions on the substrate.

12. The method according to claim 10, wherein forming the pixel defining portions comprises:
forming a pixel defining material layer on the substrate and the light shielding portions; and
exposing and developing the pixel defining material layer to remove a portion of the pixel defining material layer located within the first region, to expose a side surface of the light shielding portion adjacent to the first region.

13. The method according to claim 12, wherein a material of the pixel defining portion comprises a negative photoresist, and wherein the light shielding portion can absorb a light having a sensitive wavelength of the negative photoresist.

14. The method according to claim 13, wherein the negative photoresist is a photoresist sensitive to ultraviolet light.

* * * * *